United States Patent
Taniyama

(10) Patent No.: US 6,431,184 B1
(45) Date of Patent: Aug. 13, 2002

(54) APPARATUS AND METHOD FOR WASHING SUBSTRATE

(75) Inventor: Hiroki Taniyama, Tosu (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 09/123,718

(22) Filed: Jul. 28, 1998

(30) Foreign Application Priority Data

Aug. 5, 1997 (JP) .............................................. 9-224354

(51) Int. Cl.[7] .................................................. B08B 7/04
(52) U.S. Cl. .............................. 134/1.3; 134/1; 134/2; 134/32; 134/33; 134/34; 134/902; 134/157; 134/184
(58) Field of Search ................................. 134/184, 157, 134/148, 902, 113, 1, 1.3, 2, 3, 32, 33, 34

(56) References Cited

U.S. PATENT DOCUMENTS

| | | |
|---|---|---|
| 4,401,131 A | 8/1983 | Lawson |
| 4,985,722 A | 1/1991 | Ushjima et al. |
| 5,061,144 A | 10/1991 | Akimoto et al. |
| 5,081,733 A | 1/1992 | Kudo |
| 5,092,011 A | 3/1992 | Gommori et al. |
| 5,144,711 A | 9/1992 | Gill, Jr. |
| 5,213,118 A | 5/1993 | Kamikawa |
| 5,226,437 A | 7/1993 | Kamikawa |
| 5,236,515 A | 8/1993 | Ueno et al. |
| 5,261,431 A | 11/1993 | Ueno et al. |
| 5,278,821 A | 1/1994 | Kawamura et al. |
| 5,282,289 A | 2/1994 | Hasegawa et al. |
| 5,297,910 A | 3/1994 | Yoshioka et al. |
| 5,327,921 A | 7/1994 | Mokuo et al. |
| 5,345,639 A | 9/1994 | Tanoue et al. |
| 5,370,142 A | 12/1994 | Nishi et al. |
| 5,375,291 A | 12/1994 | Tateyama et al. |
| 5,498,294 A | 3/1996 | Matsushita et al. |
| 5,503,171 A | 4/1996 | Yokomizo et al. |
| 5,509,464 A | 4/1996 | Turner et al. |
| 5,520,744 A | 5/1996 | Fujikawa et al. |

(List continued on next page.)

FOREIGN PATENT DOCUMENTS

| | | |
|---|---|---|
| DE | 196 29 705 A1 | 1/1998 |
| JP | 58-62632 | 4/1983 |
| JP | 58-66333 | 4/1983 |

(List continued on next page.)

OTHER PUBLICATIONS

MicroPatent Abstract of JP08290136.
Derwent WPI Record of DE 19629705.

*Primary Examiner*—Alexander Markoff
(74) *Attorney, Agent, or Firm*—Morrison & Foerster LLP

(57) ABSTRACT

Disclosed is an apparatus for washing a substrate, comprising a spin chuck holding and rotating a substrate, a process solution supply mechanism having a solution discharge port through which a process solution is supplied onto the substrate rotated by the spin chuck so as to form a film of the process solution, an ultrasonic oscillator for applying an ultrasonic vibration to the film of the process solution, a relative moving mechanism for relatively moving the ultrasonic oscillator and the spin chuck so as to adjust the relative positions of the ultrasonic oscillator and the substrate, and controller for controlling each of the spin chuck, process solution supply mechanism, ultrasonic oscillator and relative moving mechanism so as to permit the ultrasonic oscillator, which extends to cover substantially a radius of the substrate, to be in contact with the film of the process solution but not to be in contact with the substrate and so as to make optimum the relationship among a gap G between the ultrasonic oscillator and the substrate, a supply amount Q of the process solution, and a rotating speed V of the substrate.

12 Claims, 5 Drawing Sheets

U.S. PATENT DOCUMENTS

| | | | |
|---|---|---|---|
| 5,626,675 A | | 5/1997 | Sakamoto et al. |
| 5,651,160 A | | 7/1997 | Yonemizu et al. |
| 5,730,162 A | | 3/1998 | Shindo et al. |
| 5,927,305 A | * | 7/1999 | Shiba .................. 134/153 |
| 5,975,098 A | * | 11/1999 | Yoshitani et al. ........... 134/148 |
| 6,021,785 A | * | 2/2000 | Grutzediek et al. .......... 134/1.3 |

FOREIGN PATENT DOCUMENTS

| | | |
|---|---|---|
| JP | 61-16528 | 1/1986 |
| JP | 61-48258 | 10/1986 |
| JP | 62-136825 | 6/1987 |
| JP | 62-47153 | 10/1987 |
| JP | 62-252147 | 11/1987 |
| JP | 64-57624 | 3/1989 |
| JP | 64-81230 | 3/1989 |
| JP | 1-120828 | 5/1989 |
| JP | 1-138721 | 5/1989 |
| JP | 1-184926 | 7/1989 |
| JP | 2-130827 | 5/1990 |
| JP | 3-52226 | 3/1991 |
| JP | 3-52228 | 3/1991 |
| JP | 3-116731 | 5/1991 |
| JP | 4-15920 | 1/1992 |
| JP | 4-56321 | 2/1992 |
| JP | 4-14494 | 3/1992 |
| JP | 4-130724 | 5/1992 |
| JP | 4-196531 | 7/1992 |
| JP | 4-304652 | 10/1992 |
| JP | 4-332129 | 11/1992 |
| JP | 5-36814 | 2/1993 |
| JP | 5-36815 | 2/1993 |
| JP | 5-121361 | 5/1993 |
| JP | 5-53241 | 7/1993 |
| JP | 5-182946 | 7/1993 |
| JP | 5-326476 | 12/1993 |
| JP | 6-204201 | 7/1994 |
| JP | 8-290136 | 11/1996 |
| JP | 9-148295 | 6/1997 |

* cited by examiner

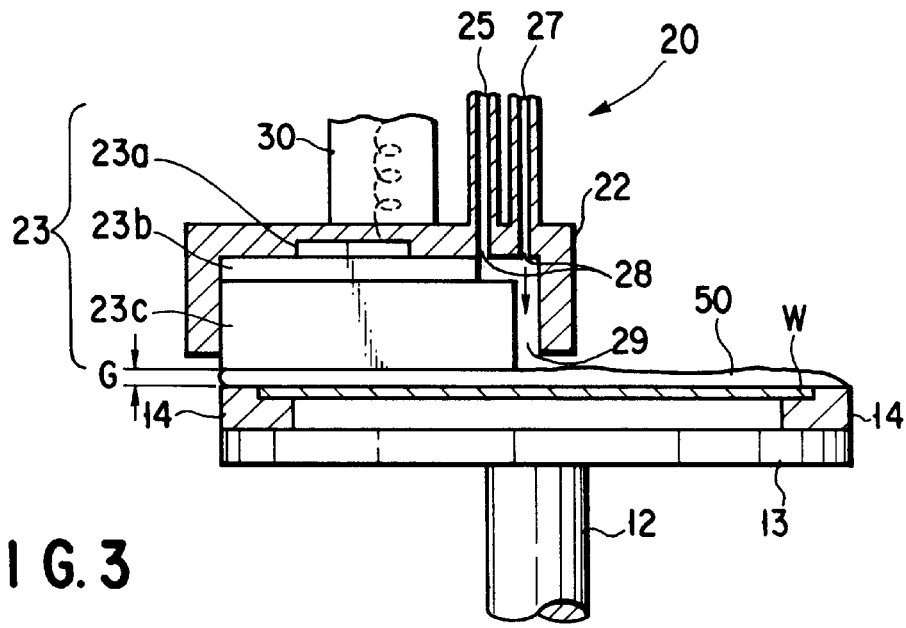
F I G. 3
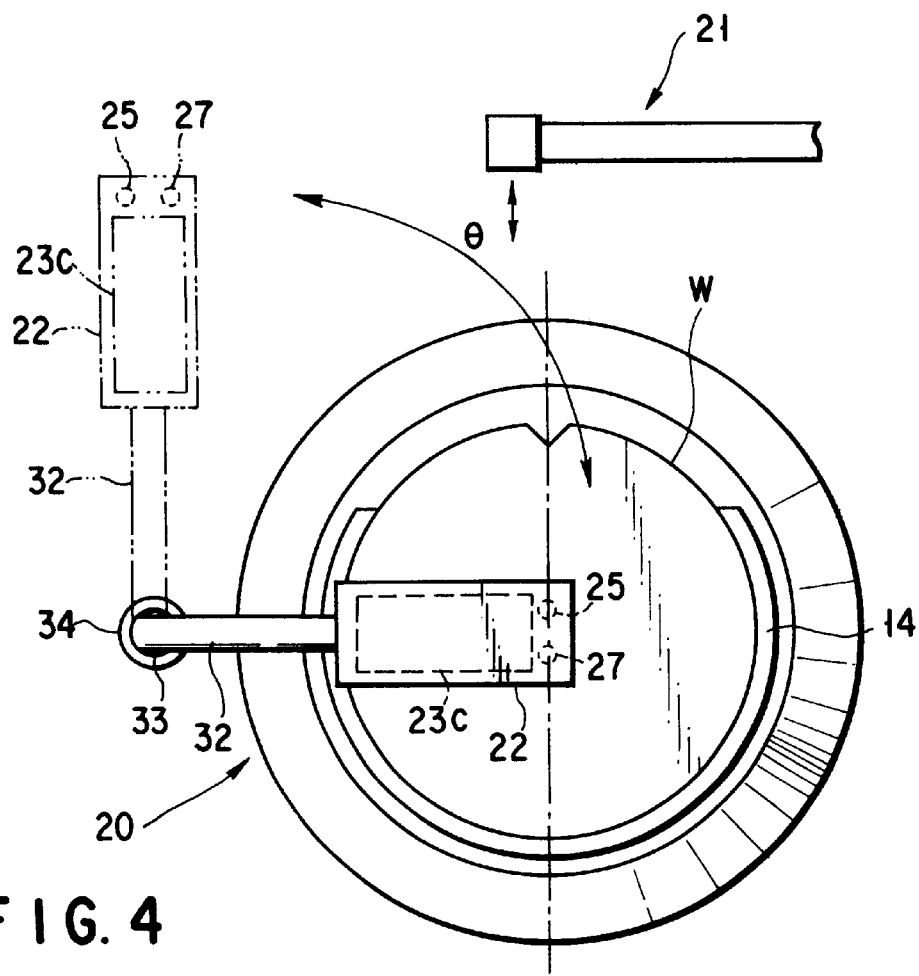
F I G. 4

APPARATUS AND METHOD FOR WASHING SUBSTRATE

BACKGROUND OF THE INVENTION

The present invention relates to an apparatus and a method for washing a surface of a substrate such as a semiconductor wafer or a glass substrate for an LCD device.

In the manufacture of a semiconductor device, a washing system is employed for removing contaminants such as particles, organic contaminants and metal impurities which are attached to a surface of a semiconductor wafer. In a one-by-one type wafer washing system, a semiconductor wafer supported by a spin chuck is washed with various chemical solutions while rotating the wafer, followed by rising with a pure water and, then, drying by a gas blowing.

In the wafer washing system of this type, proposed is a so-called "megasonic", i.e., ultrasonic wave of megaheltz, washing, in which an ultrasonic vibration is applied to a chemical solution so as to further improve the washing capability of the chemical solution. For example, Japanese Patent Disclosure (Kokai) No. 61-16528 discloses a megasonic washing, in which an ultrasonic wave of megahartz is applied to a chemical solution which is to be spurted from a nozzle. In the conventional megasonic washing, however, the ultrasonic vibration is attenuated within the chemical solution before the solution spurted from the nozzle reaches the wafer, resulting in failure to improve sufficiently the washing capability of the chemical solution. It should also be noted that bubbles tend to be formed within the chemical solution. If these bubbles stay within the nozzle, the ultrasonic wave fails to be transmitted to the substrate surface, resulting in failure to wash sufficiently the substrate surface.

Further, in the apparatus disclosed in JP '528 noted above, a nozzle is scanned along a surface of the wafer so as to supply a chemical solution uniformly over the entire surface of the wafer. In this case, however, the ultrasonic wave is applied from the scanning nozzle to the wafer surface for only a short time, leading to a low through-put of the washing treatment. What should also be noted is that, in this apparatus, a large amount of a chemical solution is required for sufficiently washing the entire surface of a wafer.

BRIEF SUMMARY OF THE INVENTION

An object of the present invention is to provide an apparatus and a method for washing a substrate which permit washing a substrate surface uniformly and also permit improving the through-put of the washing treatment.

According to an aspect of the present invention, there is provided an apparatus for washing a substrate, comprising a spin chuck holding and rotating a substrate, a process solution supply mechanism having a solution discharge port through which a process solution is supplied onto the substrate rotated by the spin chuck so as to form a film of the process solution,: an ultrasonic oscillator for applying an ultrasonic vibration to the film of the process solution, a relative moving mechanism for relatively moving the ultrasonic oscillator and the spin chuck so as to adjust the relative positions of the ultrasonic oscillator and the substrate, and control means for controlling each of the spin chuck, process solution supply mechanism, ultrasonic oscillator and relative moving mechanism so as to permit the ultrasonic oscillator, which extends to cover substantially a radius of the substrate, to be in contact with the film of the process solution but not to be in contact with the substrate and so as to make optimum the relationship among a gap G between the ultrasonic oscillator and the substrate, a supply amount Q of the process solution, and a rotating speed V of the substrate.

In the megasonic washing, the ultrasonic vibration is transmitted to the water molecules within the process solution so as to permit the vibrating water molecules to vibrate foreign matter such as particles and, thus, to facilitate removal of the foreign matter from the wafer surface. The process solution to which is applied an ultrasonic vibration is superior to an ordinary process solution in the washing capability.

In the present invention, the gap G between the ultrasonic oscillator and the substrate, the supply amount G of the process solution and the rotating speed V of the substrate is controlled to be optimum. As a result, the film of the process solution formed on the substrate is stabilized. In addition, the ultrasonic vibration, which is hardly attenuated, can be applied efficiently to the process solution.

During the operation, the ultrasonic oscillator, which has a length substantially equal to or slightly smaller than a radius of the substrate, is positioned slightly above the substrate not to extend across an axis of rotation of the substrate. The particular arrangement makes it possible to prevent a central portion of the substrate from being washed excessively and to wash the entire surface of the substrate uniformly.

It is desirable for the washing apparatus of the present invention to be equipped with a holder of the ultrasonic oscillator. The liquid discharge port of the process solution supply mechanism is defined within the holder so as to be positioned immediately sideward of the ultrasonic oscillator. The holder of the particular construction makes it possible to apply an ultrasonic vibration to the process solution immediately after discharge from the solution discharge port, leading to a further improved washing efficiency. Of course, it is possible to arrange separately the process solution supply mechanism and the ultrasonic oscillator.

According to another aspect of the present invention, there is provided a method of washing a substrate, comprising (a) the step of holding a substrate and rotating the substrate about an axis perpendicular to the washing surface of the substrate, (b) the step of supplying a process solution to the rotating substrate to form a film of the process solution on the washing surface of the substrate, (c) the step of arranging ultrasonic oscillating means, which extends to cover substantially a radius of the substrate, not to be in contact with the substrate but to be in contact with the film of the process solution for applying an ultrasonic vibration to the film of the process solution, and (d) the step of making optimum the relationship among a gap G between the ultrasonic oscillating means and the substrate, a supply amount Q of the process solution, and a rotating speed V of the substrate.

FIG. 7 shows the relationship among the gap G, the supply amount Q and the rotating speed V of the substrate. It is desirable to set the gap G between the ultrasonic oscillating means and the substrate to fall within a range of between 0.5 and 5.0 mm. If the gap G is smaller than 0.5 mm, collision may possibly take place between the ultrasonic oscillating means and the substrate. If the gap G is larger than 5.0 mm, however, it is difficult to form a film of the process solution in contact with both the ultrasonic oscillating means and the substrate. Where the gap G falls within the range noted above, bubbles are not formed in the film of the process solution. In addition, the process solution film can be formed stably on the substrate.

It is desirable for the process solution supply rate Q to fall within a range of between 0.2 and 2.0 liters/minute. If the supply amount Q is smaller than 0.2 liter/minute, it is difficult to wash sufficiently the substrate. If the supply amount Q is larger than 2.0 liters/minute, however, the process solution is discharged vigorously from the discharge port, giving rise to bubble formation within the film of the process solution. In addition, the consumption of the process solution is unduly increased.

The rotation speed V of the substrate should desirably fall within a range of between 40 and 180 rpm. If the rotation speed V is lower than 40 rpm it is difficult to supply the process solution uniformly over the entire surface region of the substrate. If the rotation speed V exceeds 180 rpm, however, the film of the process solution is rendered unstable and is likely to be broken.

Incidentally, the frequency of the ultrasonic wave should desirably fall within a range of between 400 kHz and 2 MHz. If the frequency of the ultrasonic wave is lower than 400 kHz, bubbles tend to be generated within the process solution by cavitation. On the other hand, if the frequency of the ultrasonic wave exceeds 2 MHz, the wafer surfaces receives a serious damage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 3 is a cross sectional view showing in a magnified fashion the substrate washing apparatus according to the first embodiment of the present invention;

FIG. 4 is a plan view showing the substrate washing apparatus according to the first embodiment of the present invention;

DETAILED DESCRIPTION OF THE INVENTION

Let us describe preferred embodiments of the present invention with reference to the accompanying drawings.

Figure 1:
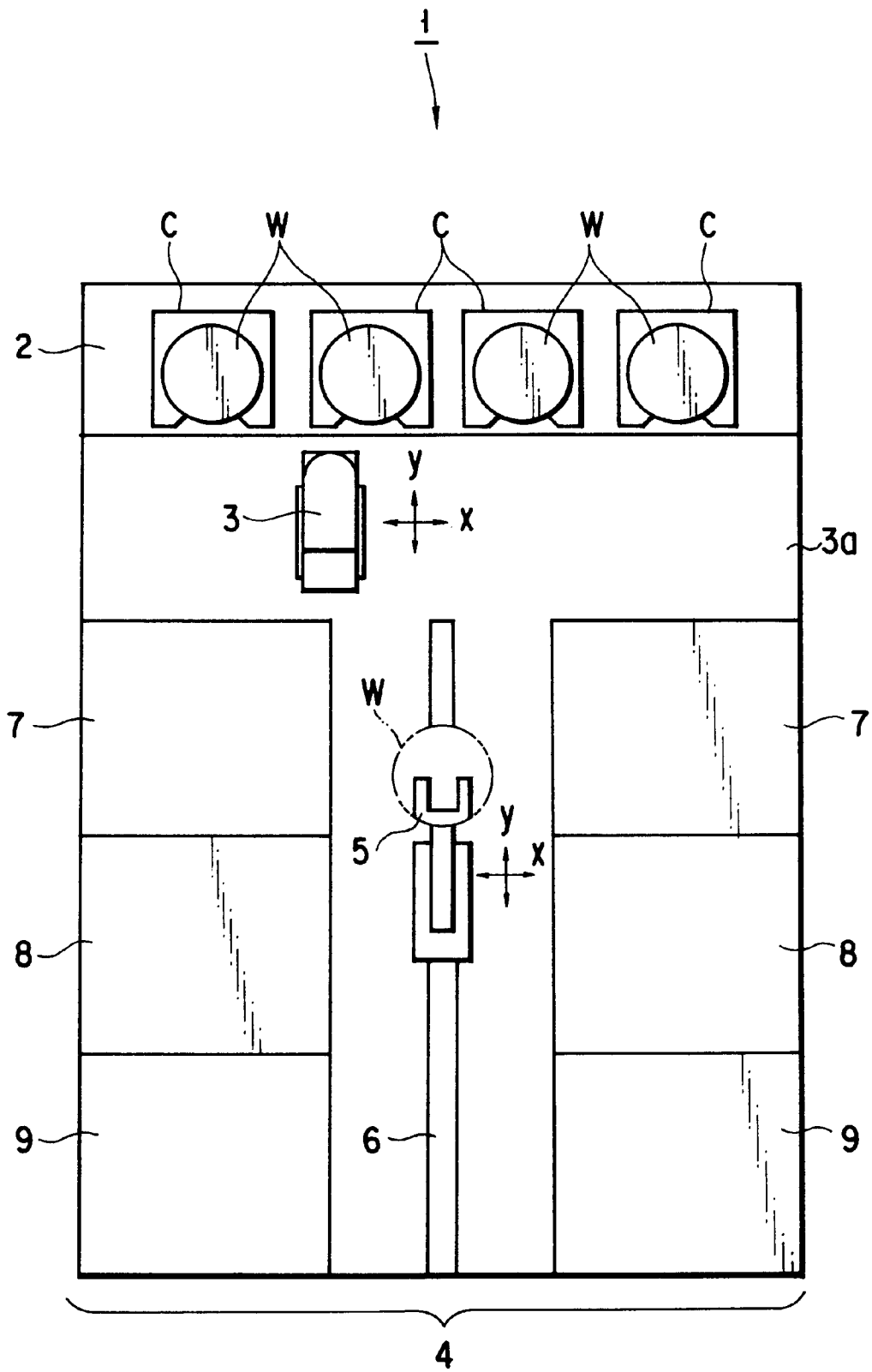
FIG. 1 is a plan view showing a substrate washing apparatus.

As shown in FIG. 1, a washing system 1 comprises a carrier station 2 and a process section 4. Four carriers C are arranged on a carrier table of the carrier station 2 extending in a direction of an X-axis. Housed in each carrier C are, for example, 25 wafers W each sized 8 inches in diameter.

A passageway 3a extending in a direction of the X-axis along the carrier table is included in the carrier station 2. A sub-arm mechanism 3 is moved on the passageway 3a. The sub-arm mechanism 3 includes a wafer holder, a back-and-forth driving mechanism for driving the wafer holder back and forth, an X-axis driving mechanism for moving the wafer holder in the X-axis direction, a Z-axis driving mechanism for moving the wafer holder in the Z-axis direction, and a swinging mechanism for swinging the wafer holder about the Z-axis by an angle θ. The wafers W before the washing treatment are taken out of the carrier C one by one by the sub-arm mechanism 3. Then, these wafers W are delivered from the sub-arm mechanism 3 onto a main arm mechanism 5. On the other hand, the wafers W after the washing treatment are delivered from the main arm mechanism 5 onto the sub-arm mechanism 3 and, then, brought back into the carrier C.

The process section 4 comprises the main arm mechanism 5, two pairs of washing units 7, 8 and a single pair of drying units 9. As apparent from the drawing, the paired washing units 7, 7 are separated from each other with a transfer passageway 6 interposed therebetween. Likewise, the washing units 8, 8 are separated from each other with the transfer passageway 6 interposed therebetween. Further, the drying units 9, 9 are separated from each other with the transfer passageway 6 interposed therebetween. In other words, a set of the washing units 7, 8 and drying unit 9 are arranged on one side of the transfer passageway 6. Also, another set of the washing units 7, 8 and drying unit 9 are arranged on the other side of the transfer passageway 6. The transfer passageway 6 extends in a direction of a Y-axis along a central portion of the process section 4. The main arm mechanism 5 is moved along the transfer passageway 6. The main arm mechanism 5 includes a wafer holder, a back-and-forth driving mechanism for driving the wafer holder back and forth, an X-axis driving mechanism for moving the wafer holder in the X-axis direction, a Z-axis driving mechanism for moving the wafer holder in the Z-axis direction, and a swinging mechanism for swinging the wafer holder about the Z-axis by an angle θ. The wafers W received from the sub-arm mechanism 3 are transferred by the main arm mechanism 5 into each of the units 7, 8 and 9. Further, the wafers after the washing treatment are delivered from the main arm mechanism 5 onto the sub-arm mechanism 3. Incidentally, it is possible to change optionally the combination of the process units depending on the kind of the washing treatment applied to the wafer W.

Each of the washing units 7 and 8 includes a spin chuck 10 for holding and rotating the wafer W, a supply mechanism 20 for supplying the chemical solution and the pure water onto the wafer W, a supply mechanism 21 for supplying an evaporated isopropyl alcohol (IPA) and a dry $N_2$ gas onto the wafer W, a controller 35 and a cup 40.

On the other hand, the drying unit 9 includes a spin chuck (not shown) for holding and rotating the wafer W, a supply mechanism (not shown) for supplying a pure water onto the substrate, a supply mechanism (not shown) for supplying an evaporated isopropyl alcohol (IPA) and a dry $N_2$ gas (inert gas) onto the substrate, a controller (not shown), and a cup (not shown).

Figure 2:
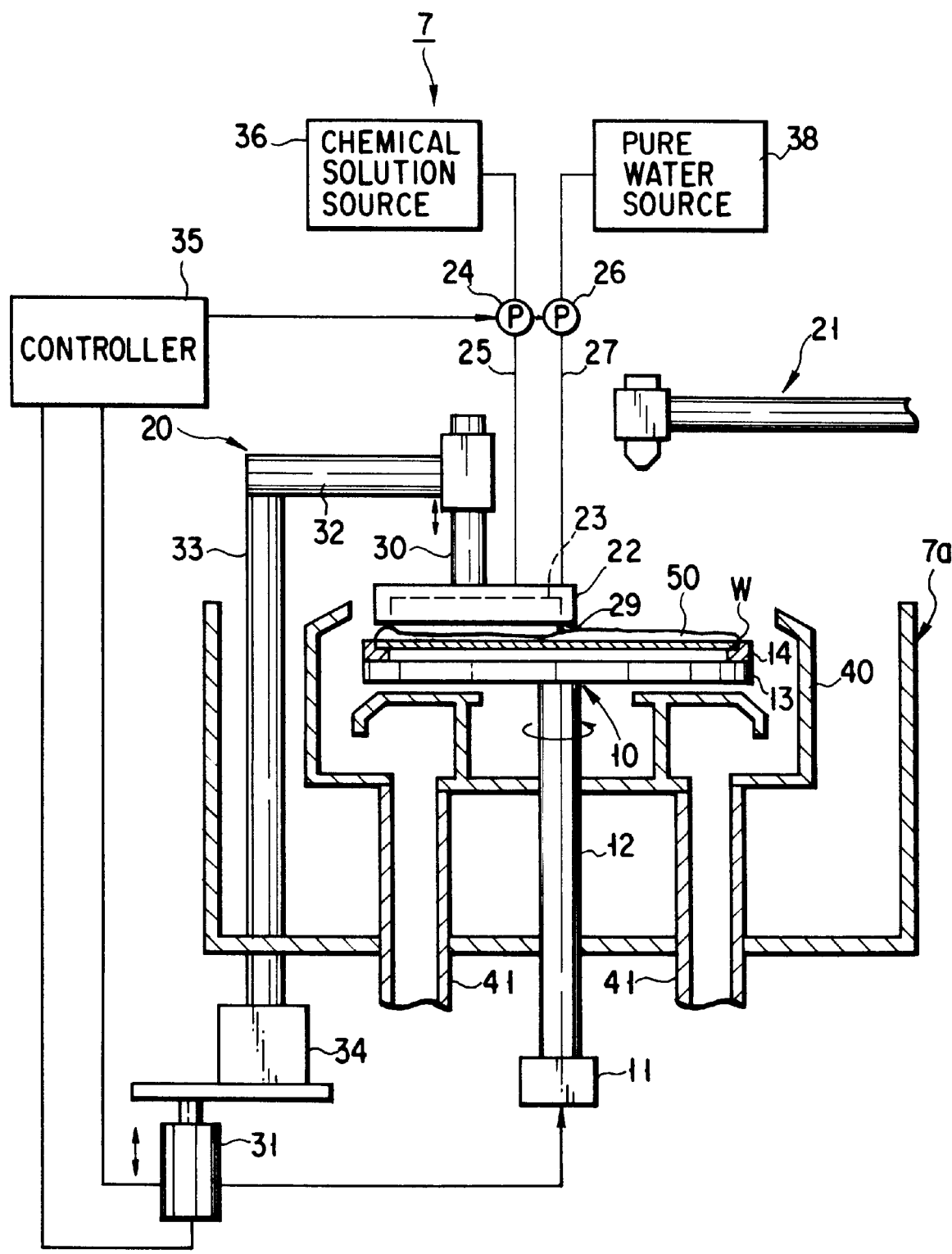
FIG. 2 is a cross sectional view showing a substrate washing apparatus according to a first embodiment of the present invention.

The substrate washing apparatus (washing unit), of the present invention is shown in detail in FIGS. 2 to 4. Incidentally, the washing units 7 and 8 are substantially equal to each other except the chemical solution used. Therefore, the washing unit 7 alone is described herein as a representative.

The washing unit 7 includes a casing 7a. Arranged within the casing 7a are the spin chuck 10, the process solution supply mechanism 20 for supplying a process solution (chemical solution and pure water) onto the wafer W, a drying mechanism 21 for supplying a mixed, gas consisting of a $N_2$ gas (inert gas) and an IPA vapor onto the wafer W, and the cup 40.

The spin chuck 10 includes a driving motor 11, a rotary shaft 12 joined to a driving shaft of the motor 11, a supporting plate 13 mounted to the upper end of the rotary shaft 12, and a holding section 14 erected along the circumferential periphery of the supporting plate 13. The peripheral portion of the wafer W is held by the holding section 14 such that the wafer W is not in contact with the supporting plate 13.

As shown in FIG. 2, the process solution supply mechanism 20 includes a box-like holder 22 movably supported by lift mechanisms 30, 31 and swinging mechanisms 32, 33, 34. Discharge ports 28 of a chemical solution supply passageway 25 and a pure water supply passageway 7 are arranged side by side in one side portion of the holder 22. Specifically, as shown in FIGS. 3 and 4, when the holder 22 is positioned to cover a radius of the wafer W, the discharge ports 28 are positioned right above a central portion of the wafer W such that a chemical solution or a pure water is supplied onto a central portion of the wafer W. The chemical solution supply passageway 25 communicates with a chemical solution supply source 36 via a pump 24. A chemical washing solution such as a hydrofluoric acid solution or an ammonia-hydrogen peroxide mixed solution is housed in the chemical solution supply source 36. On the other hand, the pure water supply passageway 27 communicates with a pure water supply source 38 via a pump 26. A pure water as a rinsing liquid is housed in the pure water supply source 38. Each of these pumps 24 and 26 is controlled by a controller 35.

A vertical shaft 30 of the lift mechanism 31 is joined to the upper end of the holder 22. The lift mechanism 31 consists of an air cylinder for vertically moving the vertical shaft 30. Also, the lift mechanism 31 is joined to and supported by one end of a horizontal arm 32 of the swinging mechanism. The other end of the horizontal arm 32 is joined to an upper end of the vertical shaft 33, and a lower end of the vertical shaft 33 is joined to the driving shaft of the motor 34. These lift mechanisms 30, 31 and the swinging mechanisms 32, 33, 34 permit the ultrasonic oscillator 23 to be positioned a predetermined distance G apart from the surface of the wafer W during the washing operation and to be retreated to a home position during non-operation, as shown in FIG. 3. Power source circuits for the lift mechanism 31, the pumps 24, 26 and the motor 11 are connected to the output section of the controller 35 such that operations of these lift mechanism, pumps and motor are controlled by the controller 35. The controller 35 serves to control optimum the relationship among the gap G between the ultrasonic oscillator and the wafer, the supply amount Q of the process solution, and the rotating speed V of the wafer W.

An ultrasonic oscillator 23 is held by the holder 22. The oscillator 23 has a length substantially equal to a radius of the wafer W and is positioned not to extend over the axis of rotation of the wafer W. In other words, the ultrasonic oscillator 23 is arranged to cover substantially the entire radius of the wafer W during the washing operation. The ultrasonic oscillator 23 includes an electrode 23a, an oscillating element 23b connected to the electrode 23a, and an oscillation transmitting member 23c bonded to the oscillating element 23b. When an electric power is supplied to the electrode 23a, an ultrasonic wave having a frequency of 900 kHz is generated from the oscillating element 23b. The ultrasonic wave thus generated is transmitted through the transmitting member 23c to a liquid film 50 formed on a surface of the wafer W. Incidentally, the lower end of the transmitting member 23c is positioned somewhat lower than the lower end of the holder 22. The transmitting member 23c is made of a corrosion resistant material such as quartz.

It should be noted that the ultrasonic oscillator 23 is in contact with the liquid film 50 formed on the wafer during the washing operation, making it possible to remove efficiently the particles, etc. attached to the surface of the wafer W. It is important to note that the ultrasonic oscillator 23 is positioned not to extend across the axis of rotation of the wafer W during the washing operation. Also, the gap G between the wafer W and the ultrasonic oscillator 23 is set to fall within a range of between 0.5 mm and 5.0 mm in order to prevent bubbles from entering the liquid film 50 filling the gap G. After the washing treatment of the wafer W, the holder 22 is moved upward and, then, swung so as to be brought back to its home position.

The atmosphere within the cup 40 is discharged through a bottom portion of the cup 40 to the outside by an exhaust means (not shown) such as a vacuum pump arranged outside the system. Further, the liquid material centrifugally separated from the wafer W during the washing treatment is collected in a bottom portion of the cup 40 so as to flow to the outside through a discharge pipe 41.

Figure 5:
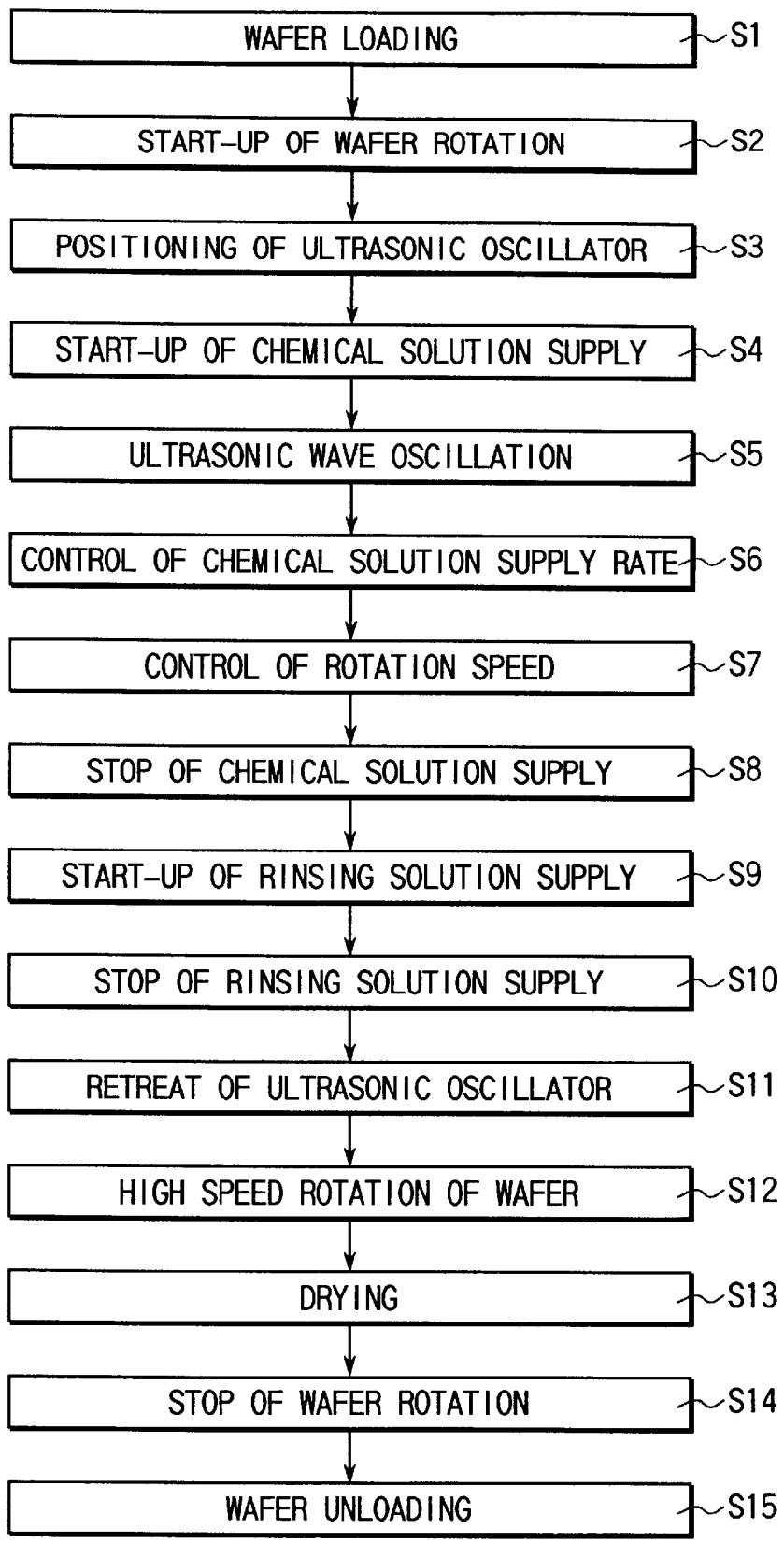
FIG. 5 is a flow chart showing a method of washing a substrate according to the first embodiment of the present invention.

FIG. 5 is a flow chart showing a method of washing, for example, a silicon wafer W using the washing system 1 described above.

In the first step, a transfer robot (not shown) transfers the carrier C into the carrier station 2 so as to dispose the carrier C on the carrier table. Housed in the carrier C are 25 silicon wafers before the washing treatment. Then, the sub-arm mechanism 3 takes a single wafer W out of the carrier C and delivers the wafer W onto the main arm mechanism 5. The wafer W is transferred successively by the main arm mechanism 5 into the washing units 7 and 8. The foreign matter attached to the wafer surface such as organic contaminants and particles are removed within these washing units 7 and 8 by washing with various chemical solutions.

Let us describe the washing treatment of the wafer W performed within the first washing unit 7 as a representative. In the first step, a shutter (not shown) is opened to permit the wafer holder of the main arm mechanism 5 to be inserted through the opening into the first washing unit 7 so as to dispose the wafer W on the supporting table 13 of the spin chuck 10 (step S1). Under this condition, the motor 11 is started so as to start rotation of the spin chuck 10 (step S2), followed by swinging the horizontal arm 32 of the swinging mechanism 34 so as to move the holder 22 from its home position onto a position above the cup 40. Then, the holder 32 is moved downward by the lift mechanism 31 so as to move the ultrasonic oscillator 23 to its operating position close to the surface of the wafer W. Further, a control signal is supplied from the controller 35 to the lift mechanism 31 so as to control optimum the gap G between the wafer W and the ultrasonic oscillator 23. The optimum gap G is set to fall within a range of between 0.5 mm and 5.0 mm so as to permit the gap G to be filled completely by the liquid film 50 such that bubbles are prevented completely from entering the liquid film 50 (step S3).

In the next step, the pump 24 is operated so as to supply a chemical solution from the chemical solution supply source 36 onto the wafer W through the fluid passageway 25 and the holder 22 (step S4). As a result, the supplied solution and the discharged solution is balanced to form the liquid film 50 of a predetermined thickness between the wafer W and the ultrasonic oscillator 23. Under this condition, an electric power is supplied to the electrode 23a so as to permit the oscillating element 23b to generate an ultrasonic wave, which is transmitted to the liquid film 50 through the transmitting member 23c (step S5). It follows that an ultrasonic vibration is imparted to the liquid film 50, with the result that the vibration is transmitted to the water molecules within the liquid film 50 so as to improve the washing efficiency of the chemical solution. In this step, a predetermined control signal is transmitted from the controller 35 to the pump 24 so as to control optimum the supply amount Q of the chemical solution. To be more specific, the optimum chemical solution supply rate is controlled to fall within a range of between 0.2 and 2.0 liters per minute such that the liquid film 50 of a high density, which is free from bubbles, is maintained in the gap between the surface of the wafer W and the ultrasonic oscillator 23 (step S6). Similarly, a predetermined control signal is supplied from the controller 35 to the motor 11 so as to control optimum the rotating speed V of the wafer W (step S7). To be more specific, the optimum rotating speed V is set to fall within a range of between 40 rpm and 180 rpm such that the liquid film 50 of a high density, which is free from bubbles, is maintained in the gap between the surface of the wafer W and the ultrasonic oscillator 23.

As described previously, the ultrasonic oscillator 23 is positioned during the washing operation not to extend across the axis of rotation of the wafer W. If the ultrasonic oscillator 23 extends across the axis of rotation of the wafer W, the central region of the wafer W is washed excessively, compared with the other region, leading to a non-uniform washing degree over the entire surface region of the wafer W incidentally, the process solution flows through the passageways 25, 27 into the holder 22 so as to be supplied through the discharge port 29 onto a central portion of the wafer W. Further, the process solution is centrifugally spread uniformly over the entire surface region of the wafer W.

During the washing treatment, the liquid film 50, which is supported between the wafer W and the ultrasonic oscillator 23, is not collapsed so as to be maintained stable. Also, since the ultrasonic vibration is substantially free from attenuation during the transmission within the liquid film 50, the washing power of the chemical solution is drastically improved. It follows that an efficient megasonic washing is applied to the surface of the wafer W. Incidentally, since the ultrasonic wave having a frequency of 400 kHz to 2 MHz is applied to the liquid film 50 of the chemical solution, the liquid film 50 is free from cavitation. It follows that fine particles can be removed from the wafer surface without doing damage to the wafer W.

A predetermined period of time after start-up of the washing treatment, the pump 24 is stopped so as to stop supplying the chemical solution to the wafer W (step S8). Then, the pump 26 is operated so as to start supplying a pure water from the pure water supply source 38 through the passageway 27 and the holder 22 for the rinsing purpose (step S9). In this rinsing step, the relationship among the gap G between the ultrasonic oscillator and the wafer, the supply amount Q of the process solution (pure water), and the rotating speed V of the wafer is made optimum so as to apply the rinsing treatment uniformly over the entire surface of the wafer W. A predetermined period of time after start-up of the rinsing operation, the pump 26 is stopped so as to stop supplying a pure water to the wafer W (step S10).

In the next step, the holder 22 is moved upward by the lift mechanism 31 so as to be brought to a position above the cup 40. Further, the arm 32 of the swinging mechanism 34 is swung so as to bring the holder 22 from the position above the cup 40 back to its home position (step S11). Then, the drying mechanism 21 is moved to a position above the wafer W, followed by rotating the wafer W at a high speed for centrifugally removing the liquid attached to the wafer W (step S12). During the centrifugal operation, a mixed gas stream consisting of a $N_2$ gas and an IPA (isopropyl alcohol) vapor is supplied from the drying mechanism 21 onto the surface of the wafer W for performing a drying operation (step S13). After the drying operation, the supply of the mixed gas stream is stopped, the drying mechanism 21 is retreated, and the wafer rotation is stopped (step S14). Then, the shutter is opened to allow the main arm mechanism 5 to take the treated wafer W out of the first washing unit 7 (step S15). Further, the wafer W is transferred into the second washing unit 8 for a washing treatment with a different kind of a chemical solution. Finally, the wafer W is rinsed with a pure water within the drying unit 9 and dried with a mixed gas consisting of an IPA vapor and a $N_2$ gas. After the treatment within the washing-dryinq process section 4, the wafer W is housed again in the carrier C. In this fashion, the remaining 24 wafers are processed one by one. After 25 wafers W have been treated, the carrier C housing 25 wafers W is transferred outside the washing-drying system 1.

In the embodiment described above, the ultrasonic oscillator 23 is positioned not in contact with the wafer but in contact with the liquid film 50 of the process solution, with the result that the ultrasonic vibration transmitted through the liquid film 50 is substantially free from attenuation so as to be applied effectively to the wafer surface. It follows that a megasonic washing can be performed efficiently. Also, since the ultrasonic oscillator 23 is in direct contact with the liquid film 50, which is also in direct contact with the surface of the wafer W, it is possible to supply uniformly a process solution onto the surface of the wafer W. It follows that the entire surface of the wafer W can be washed uniformly and efficiently, leading to an improved washing quality.

In the embodiment described above, a semiconductor wafer W is subjected to the washing-drying treatment. However, it is also possible to wash and dry other substrates such as a glass substrate of a LCD vice in the apparatus and method of the present invention.

Figure 6:
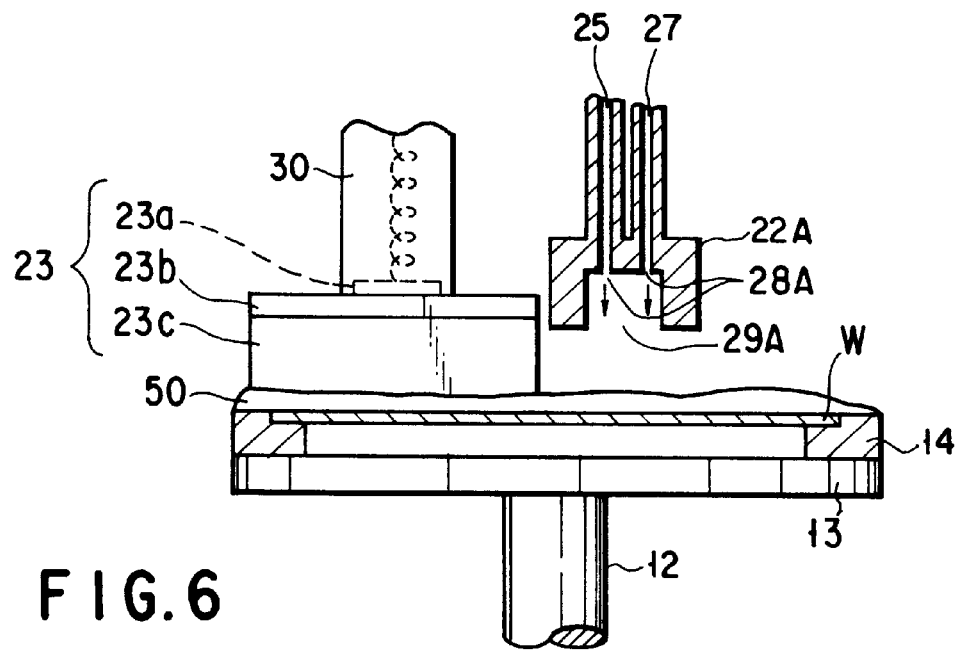
FIG. 6 is a cross sectional view showing in a magnified fashion a substrate washing apparatus according to a second embodiment of the present invention.

FIG. 6 shows a modification of the present invention. In this modification, a process solution discharge section 22A is arranged separately from the ultrasonic oscillator 23. As shown in the drawing, the process solution discharge section 22A is arranged right above a central portion of the wafer W so as to permit the process solution to be discharged from the discharge ports 28A of the fluid passageways 25, 27 onto the central portion on the surface of the wafer W. A cover portion 29 is formed in a lower portion of the process solution discharge section 22A so as to surround the discharge ports 28A. Since the cover portion 29 prevents the process solution from being scattered, the process solution is scarcely attached to the electrode 23a and the oscillating element 23b of the ultrasonic oscillator 23.

A washing apparatus as shown in FIG. 2 was actually manufactured in an attempt to look into the relationship among the gap G (mm) between the ultrasonic oscillator and the wafer surface, the supply amount Q (liters/minute) of the chemical solution, and the rotating speed V (rpm) of the wafer. Table 1 shows the experimental data:

TABLE 1

| Gap G | Chemical Solution supply rate Q (1/min) | | | |
|---|---|---|---|---|
| (mM) | 0.2 | 0.5 | 1 | 2 |
| 0.5 | 110 | 120 | 140 | 180 |
| 1.0 | 80 | 90 | 120 | 150 |
| 2.0 | 60 | 60 | 70 | 90 |
| 3.0 | 40 | 50 | 60 | 60 |
| 4.0 | N.G. | 40 | 50 | 60 |
| 5.0 | N.G. | 30 | 40 | 40 |
| 5.5 | N.G. | N.G. | 30 | 30 |
| 6.0 | N.G. | N.G. | N.G. | N.G. |

The values within Table 1 denote the upper limits of the rotating speed (rpm) of the wafer W at which the washing treatment can be performed. The symbol "N.G." denotes that it was impossible to carry out the washing. treatment.

Figure 7:
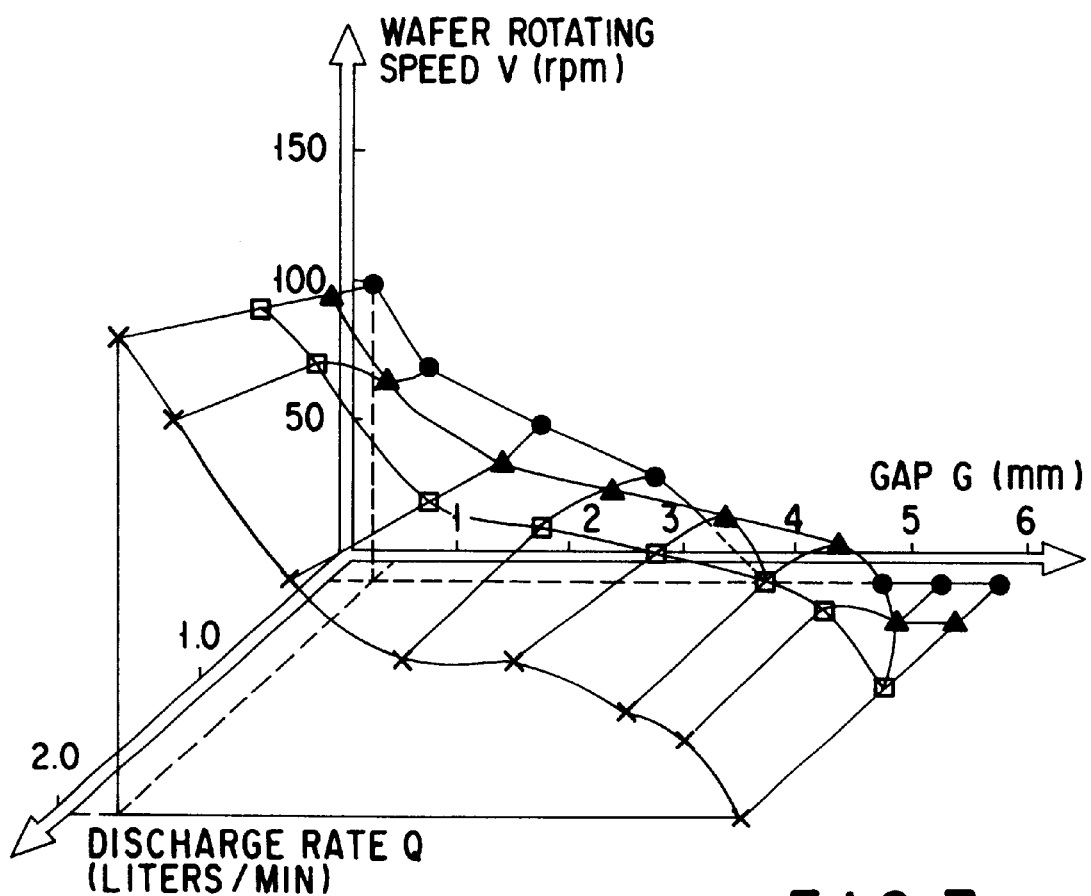
FIG. 7 is a graph showing the relationship among a gap G (mm) between an ultrasonic oscillator and a substrate, a supply amount Q (liters per minute) of a chemical solution, and a rotating speed V (rpm) of the substrate.

In this experiment, the gap G was set at 0.5 mm, 1.0 mm, 2.0 mm, 3.0 mm, 4.0 mm, 5.0 mm, 5.5 mm or 6.0 mm. On the other hand, the chemical solution supply rate Q was set at 0.2 liter/minute, 0.5 liter/minute, 1.0 liter/minute, or 2.0 liters/minute. Under these conditions, the rotating speed V of the wafer was changed variously in order to look into the conditions which permit forming a dense film 50 of the chemical solution on the wafer surface such that bubbles are not formed within the film 50. FIG. 7 also shows the experimental data.

FIG. 7 and Table 1 indicate that, where the gap G is less than 0.5 mm, it is difficult to control appropriately the position of the ultrasonic oscillator because the ultrasonic oscillator possibly collides against the wafer. On the other hand, if the gap G exceeds 5.0 mm, it is difficult to form a dense liquid film 50 between the wafer and the ultrasonic oscillator even if the chemical solution supply rate Q is increased and the rotating speed V of the wafer is lowered.

If the chemical solution supply rate Q is less than 0.2 liter/minute, it is difficult to supply a sufficiently large amount of the chemical solution onto the substrate surface, resulting in failure to wash sufficiently the substrate surface. If the supply rate Q exceeds 2.0 liters/minute, however, the chemical solution is discharged vigorously onto the substrate surface, giving rise to the bubble formation within the liquid film formed on the substrate surface. In addition, the consumption of the chemical solution is unduly increased, leading to a high washing cost.

Where the rotating speed V of the wafer is less than 40 rpm, it is difficult to supply the chemical solution uniformly onto the surface of the wafer W. If the rotating speed V exceeds 180 rpm, however, an unduly large centrifugal force is generated, leading to breakage of the liquid film formed on the wafer surface. In this case, the washing treatment is rendered unstable.

For forming a satisfactory liquid film on the wafer surface, it is important to take the relationship between the gap G and the chemical solution supply rate Q into consideration. Specifically, the chemical solution supply rate Q is required to be increased with increase in the gap G in order to stabilize the dense film 50 of the chemical solution on the wafer surface.

It is also important to take the relationship between the gap G and the rotating speed V of the wafer into consideration. Specifically, the rotating speed V of the wafer W is required to be decreased with increase in the gap G for stabilizing the liquid film formed on the wafer surface.

When it comes to the relationship between the chemical solution supply rate Q and the rotating speed V of the wafer W, the rotating speed V can be increased with increase in the chemical solution supply rate Q.

The experimental data clearly support that the gap G between the wafer surface and the ultrasonic oscillator should desirably fall within a range of between 0.5 mm and 5.0 mm. Likewise, the chemical solution supply rate Q should desirably fall within a range of between 0.2 and 2.0 liters/minute. Further, the wafer rotating speed V should desirably fall within a range of between 40 rpm and 180 rpm. FIG. 7 is a graph showing the relationship among the gap G, the chemical solution supply rate Q and the wafer rotating speed V, which permits stably forming a dense film 50 of the chemical solution, in which bubbles are not formed, on the wafer surface.

As described above, the present invention provides a washing apparatus of a substrate, in which an ultrasonic vibration is applied directly to a film of a process solution formed on a surface of a substrate. In addition, bubbles are not formed within the film of the process solution. It follows that the entire surface region of the substrate can be washed uniformly and efficiently, leading to an improved washing quality and improved productivity.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for washing a substrate, comprising:
   a spin chuck for holding and rotating a substrate;
   a process solution supply mechanism having a solution discharge port through which a process solution is supplied onto said substrate rotated by said spin chuck so as to form a film of said process solution;
   an ultrasonic oscillator having a length corresponding to at least a radius of the substrate for applying an ultrasonic vibration to said film of the process solution;
   a holder holding said ultrasonic oscillator in such a manner that the ultrasonic oscillator is positioned above the substrate and the ultrasonic oscillator is aligned with the radius of the substrate and communicated to said process solution supply mechanism such that the solution discharge port is opened at a section adjacent to the ultrasonic oscillator;
   a relative moving mechanism for relatively moving said ultrasonic oscillator and said spin chuck and positioning one end of said ultrasonic oscillator at or adjacent to a rotation center of the substrate, while simultaneously positioning another end of said ultrasonic oscillator at a position adjacent to an edge of the substrate; and
   a controller for controlling cach of the spin chuck, the process solution supply mechanism, the ultrasonic oscillator and the relative moving mechanism so as to permit the ultrasonic oscillator to be in contact with the film of the process solution but not to be in contact with the substrate and so as to adjust the relationship among a clearance G between the ultrasonic oscillator and the substrate, a supply amount Q of the process solution, and a rotating speed V of the substrate, wherein the film of the process solution is maintained between the ultrasonic oscillator and the substrate without being broken.

2. The substrate washing apparatus according to claim 1, wherein said moving mechanism includes a moving mechanism for moving said holder within an X-Y plane and a lift mechanism for moving said holder in a direction of a Z-axis so as to permit the solution discharge port to be positioned above the center of rotation of the substrate.

3. The substrate washing apparatus according to claim 1, wherein said control means controls said relative moving mechanism to set said clearance G to fall within a range of between 0.5 mm and 5.0 mm.

4. The substrate washing apparatus according to claim 1, wherein said controller controls said process solution supply mechanism to set said supply rate Q of the process solution to fall within a range of between 0.2 liters per minute and 2.0 liters per minute.

5. The substrate washing apparatus according to claim 1, wherein said controller controls said spin chuck to set the rotating speed V of the substrate to fall within a range of between 40 rpm and 180 rpm.

6. The substrate washing apparatus according to claim 1, wherein said process solution supply mechanism includes a first solution discharge port for discharging a chemical solution and a second discharge port for discharging a rinsing solution.

7. The substrate washing apparatus according to claim 1, wherein said ultrasonic oscillator oscillates an ultrasonic wave having a frequency band falling within a range of between 400 kHz and 2 MHz.

8. A method of washing a substrate, said method comprising the steps of:

holding a substrate and rotating the substrate about an axis perpendicular to the washing surface of the substrate;

supplying a process solution to the rotating substrate to form a film of the process solution on the washing surface of the substrate;

anging an ultrasonic oscillator, which has a length corresponding to at least a radius of the substrate, suct that one end of said ultrasonic oscillator is positioned at or adjacent to a center of the substrate and another end of said ultrasonic oscillator is positioned adjacent to an edge of the substrate, while simultaneously bringing said ultrasonic oscillator into contact with the film of the process solution for applying an ultrasonic vibration to the film of the process solution;

bringing said ultrasonic oscillator above the substrate when said ultrasonic oscillator is applying an ultrasonic wave to the film of the process solution existing on the rotating substrate; and while keeping the ultrasonic oscillator in a fixed horizontal position, adjusting the relationship among a clearance G between the ultrasonic oscillator and the substrate, a supply amount Q of the process solution, and a rotating speed V of the substrate to maintain the film of the process solution between the ultrasonic oscillator and the substrate.

9. The substrate washing method according to claim 8, wherein said clearance G between the ultrasonic oscillator and the substrate is adjusted to fall within a range of between 0.5 mm and 5.0 mm.

10. The substrate washing method according to claim 8, wherein said supply rate Q of the process solution is adjusted to fall within a range of between 0.2 liters per minute and 2.0 liters per minute.

11. The substrate washing method according to claim 8, wherein said rotating speed V of the substrate is adjusted to fall within a range of between 40 rpm and 180 rpm.

12. The substrate washing method according to claim 8, wherein said ultrasonic oscillator oscillates an ultrasonic wave having a frequency band of 400 kHz to 2 MHz.

* * * * *